(12) United States Patent
Matsui et al.

(10) Patent No.: US 9,578,738 B2
(45) Date of Patent: Feb. 21, 2017

(54) WIRING BOARD AND MOUNTING STRUCTURE INCLUDING THE SAME

(71) Applicant: KYOCERA Corporation, Kyoto-shi, Kyoto (JP)

(72) Inventors: Takeshi Matsui, Kyoto (JP); Katsura Hayashi, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 20 days.

(21) Appl. No.: 14/646,065

(22) PCT Filed: Nov. 13, 2013

(86) PCT No.: PCT/JP2013/080698
§ 371 (c)(1),
(2) Date: May 20, 2015

(87) PCT Pub. No.: WO2014/084050
PCT Pub. Date: Jun. 5, 2014

(65) Prior Publication Data
US 2015/0296613 A1    Oct. 15, 2015

(30) Foreign Application Priority Data
Nov. 28, 2012    (JP) .................. 2012-259426

(51) Int. Cl.
*H05K 1/03*    (2006.01)
*H05K 1/02*    (2006.01)
(Continued)

(52) U.S. Cl.
CPC .......... *H05K 1/0306* (2013.01); *H05K 1/0298* (2013.01); *H05K 1/115* (2013.01);
(Continued)

(58) Field of Classification Search
CPC .. H05K 1/0298; H05K 1/0306; H05K 1/0373; H05K 3/4605; H05K 3/4652; H05K 3/4655; H05K 2201/0209; H05K 2201/09036; H05K 2201/0269
See application file for complete search history.

(56) References Cited

U.S. PATENT DOCUMENTS 4,914,260 A * 4/1990 Suzuki ................ H01L 21/4857
174/255
5,144,536 A * 9/1992 Tsukada .............. H01L 21/4807
174/258
(Continued)

FOREIGN PATENT DOCUMENTS

JP    2005-223226 A    8/2005
JP    2005-317953 A    11/2005
(Continued)

OTHER PUBLICATIONS

International Search Report, PCT/JP2013/080698, Feb. 10, 2014, 1 pg.

*Primary Examiner* — Hoa C Nguyen
(74) *Attorney, Agent, or Firm* — Volpe and Koenig, P.C.

(57) ABSTRACT

According to an aspect of the invention, a wiring board includes an inorganic insulating layer and a conductive layer disposed on part of one main surface of the inorganic insulating layer. The part of the one main surface of the inorganic insulating layer includes a plurality of first recessed portions each of which has at least partially circular shape in a plan view. Part of the conductive layer enters into the plurality of first recessed portions. According to the aspect of the invention, it is possible to obtain a wiring board capable of reducing disconnection of the conductive layer and therefore having superior electrical reliability.

5 Claims, 11 Drawing Sheets

(51) Int. Cl.
*H05K 3/46* (2006.01)
*H05K 1/11* (2006.01)
*H05K 1/18* (2006.01)

(52) U.S. Cl.
CPC .......... *H05K 1/181* (2013.01); *H05K 3/4655* (2013.01); *H05K 1/0373* (2013.01); *H05K 3/4602* (2013.01); *H05K 3/4652* (2013.01); *H05K 2201/0195* (2013.01); *H05K 2201/0209* (2013.01); *H05K 2201/0269* (2013.01); *H05K 2201/068* (2013.01); *H05K 2201/09036* (2013.01)

(56) References Cited

U.S. PATENT DOCUMENTS

| | | |
|---|---|---|
| 2011/0073358 A1 | 3/2011 | Hayashi |
| 2011/0189432 A1 | 8/2011 | Goto et al. |
| 2012/0189818 A1 | 7/2012 | Hayashi |
| 2012/0189826 A1 | 7/2012 | Hayashi |
| 2013/0256018 A1 | 10/2013 | Hayashi |
| 2013/0288041 A1 | 10/2013 | Goto et al. |

FOREIGN PATENT DOCUMENTS

| | | |
|---|---|---|
| WO | 2010-013741 A1 | 2/2010 |
| WO | 2011/037260 A1 | 3/2011 |

\* cited by examiner (a)

(b)

(a)

(b)

(a)

(b)

(a)

(b)

(a)

(b)

(a)

(b)

(a)

(b)

(a)

(b)

(c)

WIRING BOARD AND MOUNTING STRUCTURE INCLUDING THE SAME

TECHNICAL FIELD

The present invention relates to a wiring board and a mounting structure including the same used in electronic devices (for example, audio-visual equipment, household electrical appliances, communication devices, computer devices, and peripheral devices thereof).

BACKGROUND ART

In the related art, a mounting structure including an electronic component and a wiring board on which the electronic component is mounted has been used in an electronic device.

As such a wiring board, for example, Japanese Unexamined Patent Publication JP-A 2005-223226 discloses a composite multilayer board (wiring board) including a ceramic layer (inorganic insulating layer), a conductive pattern (conductive layer) that is disposed on part of a main surface of the ceramic layer, and a resin layer that is disposed on another part of the ceramic layer.

The inorganic insulating layer and the conductive layer have different thermal expansion coefficients. Thus, if heat is applied to the wiring board when the electronic component is mounted or operated, thermal stress may be generated between the inorganic insulating layer and the conductive layer. Accordingly, the inorganic insulating layer and the conductive layer may be separated from each other. As a result, disconnection may occur in the conductive layer, and thus, electrical reliability of the wiring board may be lowered.

Accordingly, there is demand for provision of a wiring board having superior electrical reliability.

SUMMARY OF INVENTION

An object of the invention is to provide a wiring board having superior electrical reliability and a mounting structure having the wiring board mounted thereon to satisfy the above-mentioned demand.

A wiring board according to an aspect of the invention includes: an inorganic insulating layer; and a conductive layer disposed on part of one main surface of the inorganic insulating layer. The part of the one main surface of the inorganic insulating layer includes a plurality of first recessed portions each of which has at least partially circular shape in a plan view. Part of the conductive layer enters into the plurality of first recessed portions.

According to the aspect of the invention, it is possible to obtain a wiring board capable of reducing disconnection of a conductive layer and therefore having superior electrical reliability.

DESCRIPTION OF EMBODIMENTS

Hereinafter, a mounting structure provided with a wiring board according to an embodiment of the invention will be described with reference to the accompanying drawings.

Figure 1:
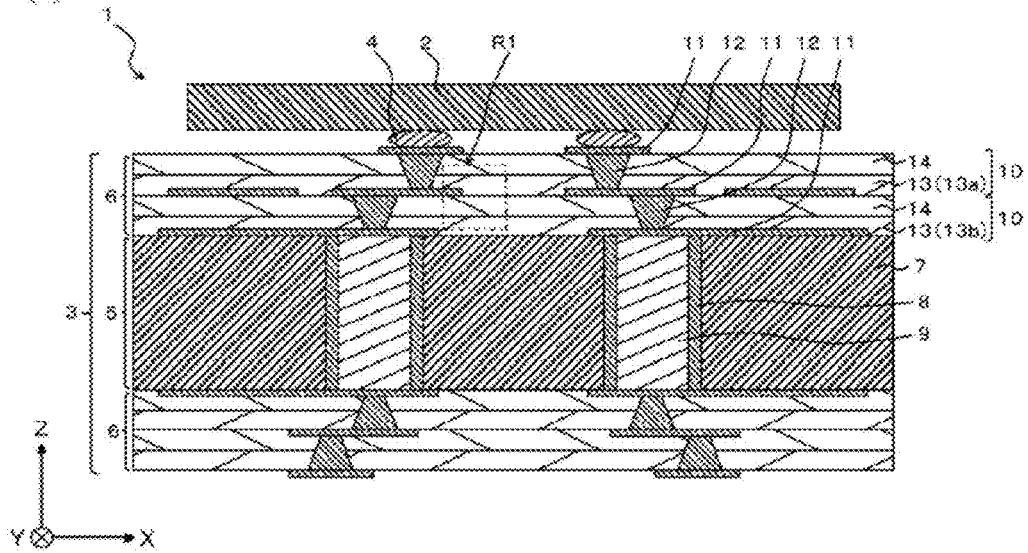
FIG. 1(*a*) is a sectional view illustrating a thickness-directional section of a mounting structure according to an embodiment of the invention, and FIG. 1(*b*) is an enlarged sectional view of an R1 portion in FIG. 1(*a*)
Figure 1:
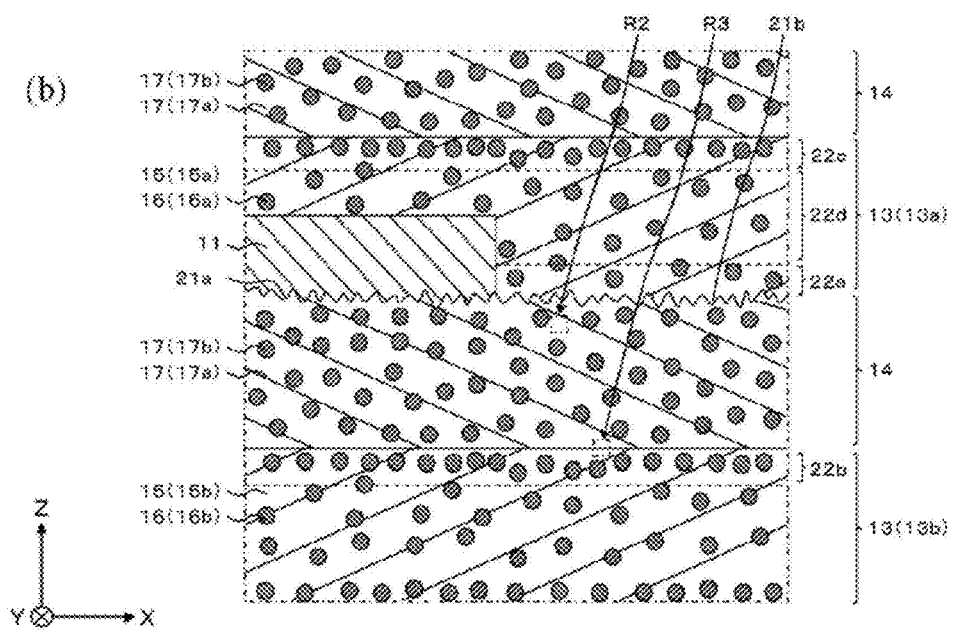
Figure 2:
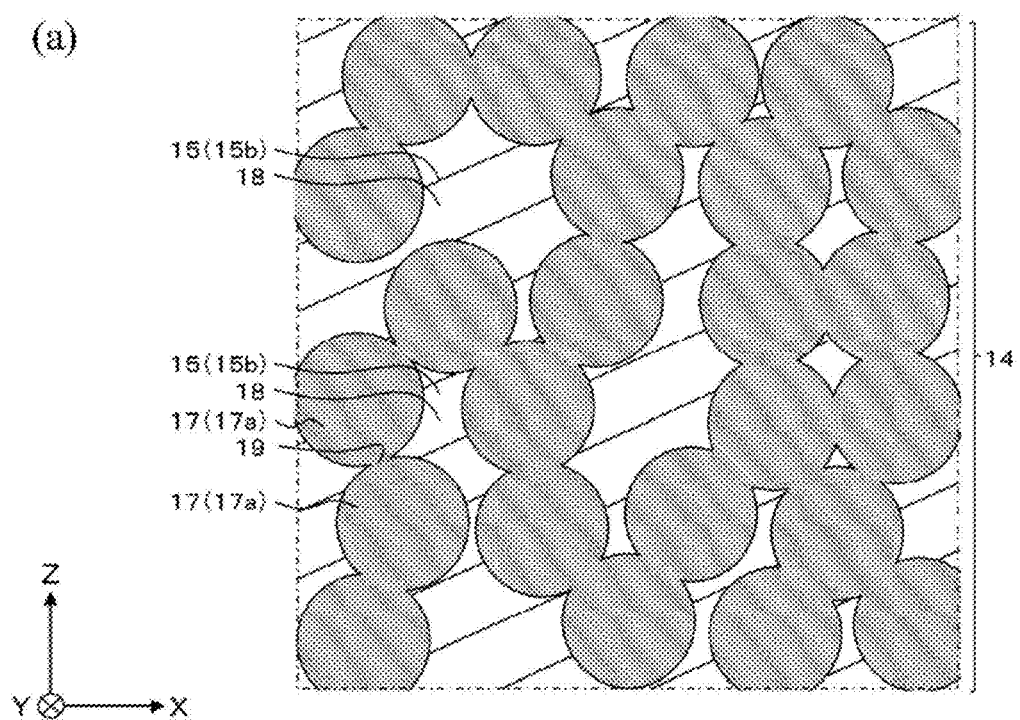
FIG. 2(*a*) is an enlarged sectional view of an R2 portion in FIG. 1(*b*), and FIG. 2(*b*) is an enlarged sectional view of an R3 portion in FIG. 1(*b*)
Figure 2:
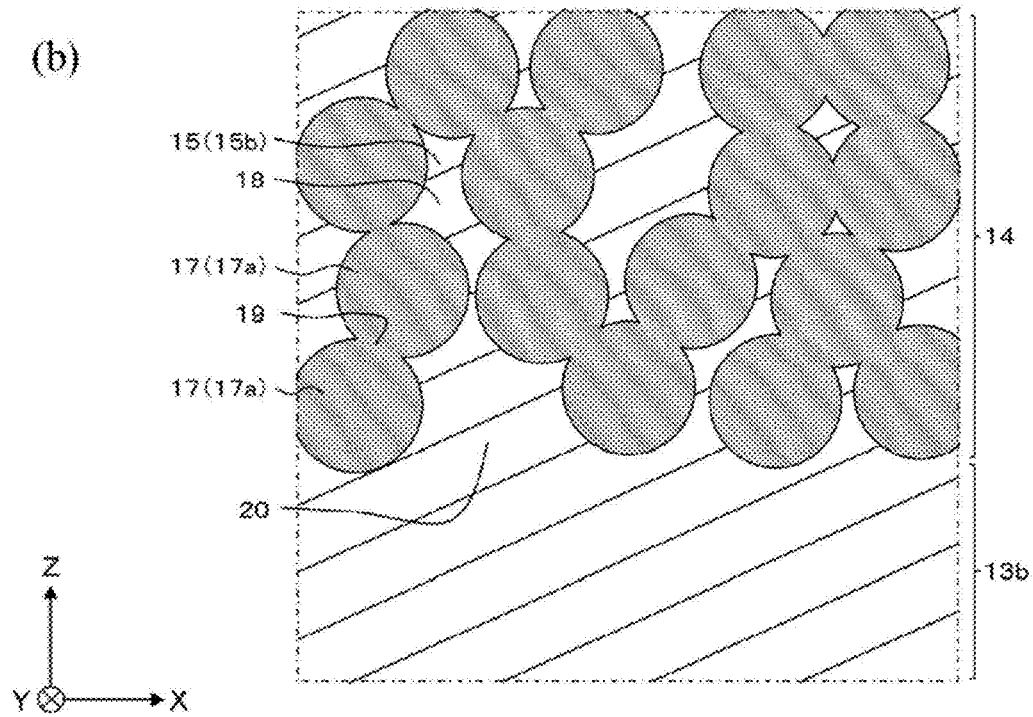

A mounting structure 1 shown in FIG. 1(*a*) is used in various electronic devices such as audio-visual devices, household electrical appliances, communication devices, computer devices, or peripheral devices thereof, for example. The mounting structure 1 includes an electronic component 2, and a wiring board 3 on which the electronic component 2 is mounted.

The electronic component 2 is a semiconductor element such as an IC or an LSI, for example. The electronic component 2 is flip-chip-mounted on the wiring board 3 through a bump 4 made of a conductive material such as solder. The electronic component 2 is made of a semiconductor material such as silicon, germanium, gallium arsenide, gallium arsenide phosphide, gallium nitride, or silicon carbide, for example. The thickness of the electronic component 2 is 0.1 mm or more and 1 mm or less, for example. Further, a thermal expansion coefficient of the electronic component 2 in a main surface direction (XY surface direction) and a thickness direction (Z direction) is 2 ppm/° C. or more and 7 ppm/° C. or less, for example.

The thermal expansion coefficient of the electronic component 2 is measured by a measurement method based on JIS K7197-1991 using a commercially available thermomechanical analysis (TMA) device. Then, a thermal expansion coefficient of each component is measured in a similar way to the electronic component 2.

The wiring board 3 supports the electronic component 2, and has a function of supplying power or a signal for driving or controlling the electronic component 2. The wiring board 3 includes a core substrate 5, and a pair of build-up layers 6 arranged on opposing main surfaces of the core substrate 5.

The core substrate 5 is configured to provide conduction between the pair of build-up layers 6 while improving rigidity of the wiring board 3. The core substrate 5 includes a base 7 that supports the build-up layers 6, a cylindrical through hole conductor 8 that is disposed in a through hole formed through the base 7 in the thickness direction, and a columnar insulator 9 that is surrounded by the through hole conductor 8.

The base 7 provides the wiring board 3 with a high rigidity and a low thermal expansion coefficient. The base 7 includes resin such as epoxy resin, a base material such as resin-coated glass cloth, filler particles made of silicon oxide, or the like and is dispersed in the resin, for example. The thickness of the base 7 is 0.04 mm or more and 2 mm or less, for example.

The through hole conductor 8 electrically connects the pair of build-up layers 6. The through hole conductor 8 is made of a conducive material such as copper, silver, gold, aluminum, nickel or chrome, for example.

The insulator 9 fills a space inside the through hole conductor 8. The insulator 9 is made of a resin material such as epoxy resin, for example.

On the other hand, as described above, the pair of build-up layers 6 is disposed on the opposing main surfaces of the core substrate 5. One build-up layer 6 among the pair of build-up layers 6 is connected to the electronic component 2 through the bump 4, and the other build-up layer 6 is connected to an external, circuit through a solder ball (not shown), for example.

The build-up layer 6 includes plural insulating layers 10 that are layered on the base 7, plural conductive layers 11 that are partially disposed on the base 7 or the insulating layers 10, and plural via conductors 12 formed through the insulating layers 10 in the thickness direction.

The insulating layer 10 functions as an insulating member between the conductive layers 11 separated in the thickness direction or the main surface direction, or an insulating member between the via conductors 12 separated in the main surface direction. Details about the insulating layers 10 will be described later.

The conductive layers 11 are separated from each other in the thickness direction or the main surface direction, and function as a wiring such as a ground wiring, a power supply wiring or a signal wiring. The conductive layer 11 is made of a conductive material such as copper, silver, gold, aluminum, nickel or chrome, for example. Further, the thickness of the conductive layer 11 is 3 µm or more and 20 µm or less. A thermal expansion coefficient of the conductive layer 11 in the thickness direction and the main surface direction is 14 ppm/° C. or more and 18 ppm/° C. or less, for example. Further, a Young's modulus of the conductive layer 11 is 70 GPa or more and 150 GPa or less, for example.

The Young's modulus of the conductive layer 11 is measured by a method based on ISO14577-1: 2002 using NANOINDENTOR XP made by MTS. Then, a Young's modulus of each component is measured in a similar way to the conductive layer 11.

The via conductor 12 electrically connects the conductive layers 11 that are separated from each other in the thickness direction. The via conductor 12 is made of the same material as that of the conductive layer 11, and has the same characteristics as that of the conductive layer 11. Further, the via conductor 12 has a columnar shape of which the width becomes narrow toward the core substrate 5, for example. The width of the via conductor 12 is 10 µm or more and 75 µm or less, for example.

Next, the insulating layer 10 will be described in detail.

The insulating layer 10 includes a resin layer 13 that is disposed on a side of the core substrate 5, and an inorganic insulating layer 14 that is disposed on a side opposite to the core substrate 5. The conductive layer 11 is disposed on part of one main surface of the inorganic insulating layer 14 on a side opposite to the core substrate 5. Part of the resin layer 13 of the adjacent insulating layer 10 is disposed on another part of the one main surface of the inorganic insulating layer 14.

The resin layer 13 functions as a bonding member in the insulating layer 10. Further, the resin layer 13 is configured so that a part thereof is disposed between the conductive layers 11 disposed on the side of the core substrate 5, and functions as an insulating member between the conductive layers 11 separated from each other in the main surface direction. Further, the resin layer 13 has a smaller Young's modulus compared with that of the inorganic insulating layer 14, and is easily elastically deformed. Thus, the resin layer 13 can suppress occurrence of cracks in the wiring board 3. The thickness of the resin layer 13 is 3 µm or more and 30 µm or less, for example. The Young's modulus of the resin layer 13 is 0.2 GPa or more and 20 GPa or less, for example. The thermal expansion coefficient of the resin layer 13 in the thickness direction and the main surface direction is 20 ppm/° C. or more and 50 ppm/° C. or less, for example.

As shown in FIG. 1(b), the resin layer 13 includes a resin 15 and plural filler particles 16 dispersed in the resin 15.

The resin 15 functions as a bonding member in the resin layer 13. The resin 15 is made of thermosetting resin such as epoxy resin, bismaleimide triazine resin, cyanate resin, polyphenylene ether resin, wholly aromatic polyamide resin or polyimide resin, for example. The Young's modulus of the resin 15 is 0.1 GPa or more and 5 GPa or less, for example. The thermal expansion coefficient of the resin 15 in the thickness direction and the main surface direction is 20 ppm/° C. or more and 50 ppm/° C. or less, for example.

The filler particles 16 provide the resin layer 13 with a high rigidity and a low thermal expansion coefficient. The filler particles 16 are made of an inorganic insulating material such as silicon oxide, aluminum oxide, aluminum nitride, aluminum hydroxide or calcium carbonate, for example. An average particle diameter of the filler particles 16 is 0.5 µm or more and 5 µm or less, for example. The thermal expansion coefficient of the filler particles 16 is 0 ppm/° C. or more and 15 ppm/° C. or less, for example. The content ratio of the filler particles 16 in the resin layer 13 is 3 vol % or more and 60 vol % or less, for example.

By calculating an average value of particle diameters of the respective particles in a section of the wiring board 3 in the thickness direction, it is possible to measure the average particle diameter of the filler particles 16. Further, in a section of the wiring board 3 in the thickness direction, by considering the ratio of an area occupied by the filler particles 16 in the resin layer 13 as the content ratio (vol %), it is possible to measure the content ratio of the filler particles 16 in the resin layer 13. Then, an average particle diameter and a content ratio of each component are measured in a similar way to the filler particles 16.

The inorganic insulating layer 14 is configured so that the conductive layers 11 are disposed on part of one main surface thereof opposite to the core substrate 5, and functions as a supporting member of the conductive layers 11. Further, the inorganic insulating layer 14 provides the insulating layer 13 with a high rigidity and a low thermal expansion coefficient, to thereby make it possible to reduce a difference in the thermal expansion coefficients of the electronic component 2 and the wiring board 3. Thus, when heat is applied to the mounting structure 1 when the electronic component 2 is mounted or operated, it is possible to reduce warpage due to the difference in the thermal expansion coefficients of the electronic component 2 and the wiring board 3. The thickness of the inorganic insulating layer 14 is 3 µm or more and 30 µm or less, for example. The Young's modulus of the inorganic layer 14 is 10 GPa or more and 50 GPa or less, for example. Further, the thermal expansion coefficient of the inorganic insulating layer 14 in the thickness direction and the main surface direction is 0 ppm/° C. or more and 10 ppm/° C. or less, for example.

As shown in FIG. 1(b) to FIG. 2(b), the inorganic insulating layer 14 includes plural inorganic insulating particles 17, and the respective inorganic insulating particles 17 are partly connected to each other, and a gap 18 is formed between the plural inorganic insulating particles 17. That is, the inorganic insulating layer 14 is made of a porous material, and has a three-dimensional network structure in which the inorganic insulating particles 17 are connected to each other. Further, a connecting portion 19 between the plural inorganic insulating particles 17 has a constricted shape, and forms a neck-like structure. Since the plural inorganic insulating particles 17 are connected to each other to be constricted in the inorganic insulating layer 14, the plural inorganic insulating particles 17 do not flow like the filler particles 16 dispersed in the resin layer 13. Thus, it is possible to provide the inorganic insulating layer 14 having a high rigidity and a low thermal expansion coefficient.

The plural inorganic insulating particles 17 include plural first inorganic insulating particles 17a, and the respective first inorganic insulating particles 17a are partly connected to each other, and plural second inorganic insulating particles 17b having a particle diameter larger than that of the first inorganic insulating particles 17a, the respective second inorganic insulating particles 17b are partly connected to the first inorganic insulating particles 17a, and the second inorganic insulating particles 17b are separated from each other with the first inorganic insulating particles 17a interposed therebetween. The content ratio of the plural second inorganic insulating particles 17a in the plural inorganic insulating particles 17 is 20 vol % or more and 90 vol % or less, for example. The content ratio of the second inorganic particles 17b in the plural inorganic insulating particles 17 is 10 vol % or more and 80 vol % or less, for example.

The first inorganic insulating particles 17a function as bonding members in the inorganic insulating layer 14. The inorganic insulating particles 17a are made of an inorganic insulating material such as silicon oxide, aluminum oxide, boron oxide, magnesium oxide or calcium oxide, for example. In particular, it is preferable to use the silicon oxide as the inorganic insulating material from the viewpoint of a low thermal expansion coefficient and a low dielectric loss tangent. In this case, the first inorganic insulating particles 17a may include the silicon oxide of 90 mass % or higher. Further, it is preferable that the silicon oxide be in an amorphous (non-crystalline) state in order to reduce anisotropy of the thermal expansion coefficient due to a crystalline structure.

The first inorganic particles 17a have a spherical shape, for example. Further, the average particle diameter of the first inorganic insulating particles 17a is 3 nm or more and 110 nm or less, for example. In this way, since the particle diameter of the first inorganic insulating particles 17a is fine, it is possible to provide the inorganic insulating layer 14 having a high rigidity and a low thermal expansion coefficient. Further, as described later, when manufacturing the inorganic insulating layer 14, it is possible to easily connect the first inorganic insulating particles 17a to each other.

Since the second inorganic insulating particles 17b have a larger particle diameter, energy necessary for cracks generated in the inorganic insulating layer 14 to detour the second inorganic insulating particles 17b is increased. Thus, the second inorganic insulating particles 17b can suppress extension of the cracks. The second inorganic insulating particles 17b may be made of the same material as that of the first inorganic insulating particles 17a. In particular, it is preferable that the second inorganic insulating particles 17b use the same material as that of the first inorganic insulating particles 17a in order to make material characteristics thereof close to those of the first inorganic insulating particles 17a. The second inorganic insulating particles 17b have a spherical shape, for example. Further, the average particle diameter of the second inorganic insulating particles 17b is 0.5 µm or more and 5 µm or less, for example. Since the particle diameter of the second inorganic insulating particles 17b is large, it is possible to preferably suppress the extension of the cracks in the inorganic insulating layer 14.

The gap 18 is an open pore, and has an opening 20 on the other main surface of the inorganic insulating layer 14. Further, since the inorganic insulating layer 14 is made of the porous material and has the three-dimensional network structure, at least a part of the gap 18 is surrounded by the inorganic insulating particles 17 in the section of the inorganic insulating layer 14 in the thickness direction. Part of the resin layer 13 enters into the gap 18, and particularly, part of the resin 15 enters thereinto. As a result, stress applied to the inorganic insulating layer 14 by the resin 15 which is easily elastically deformed is alleviated, and thus, it is possible to suppress occurrence of cracks in the inorganic insulating layer 14. The ratio of the gap 18 in the inorganic insulating layer 14 and the gap 18 is 10 vol % or more and 50 vol % or less, for example.

Here, as shown in FIG. 1(b), for ease of description, with respect to one inorganic insulating layer 14, the resin layer 13 that is disposed on one main surface opposite to the core substrate 5 is represented as a first resin layer 13a, and the resin layer 13 that is disposed on the other main surface of the core substrate 5 is represented as a second resin layer 13b. Further, the resin 15 of the first resin layer 13a is represented as a first resin 15a, and the resin 15 of the second resin layer 13b is represented as a second resin 15b. Further, the filler particles 16 of the first resin layer 13a is represented as first filler particles 16a, and the filler particles 16 of the second resin layer 13b is represented as second filler particles 16b.

The inorganic insulating layer 14 and the conductive layer 11 have different thermal expansion coefficients. Thus, if heat is applied to the wiring board 3 when the electronic component 2 is mounted or operated, thermal stress may be applied between the inorganic insulating layer 14 and the conductive layer 11.

On the other hand, the wiring board 3 of the present embodiment includes the inorganic insulating layer 14, and the conductive layer 11 that is disposed on part of one main surface of the inorganic insulating layer 14, as shown in FIG.

Figure 3:
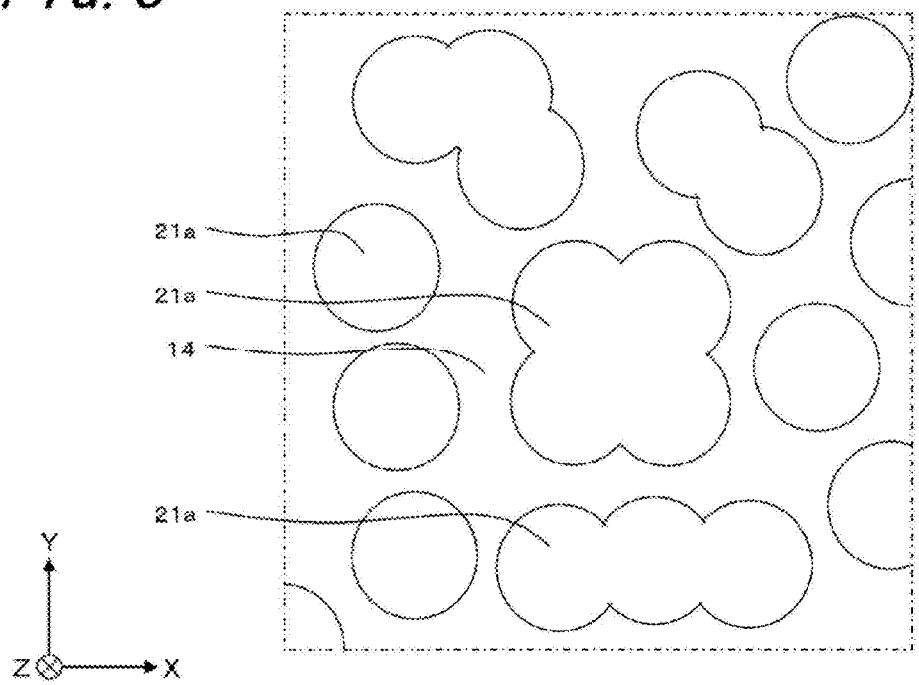
FIG. 3 is an enlarged plan view of a portion where first recessed portions are formed, in one main surface of an inorganic insulating layer in FIG. 1(*b*)
Figure 4:
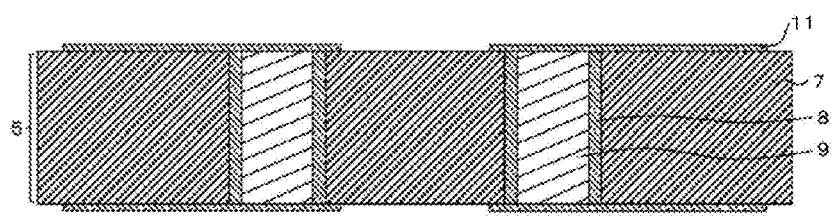
FIG. 4(*a*) and FIG. 4(*b*) are sectional views illustrating a process of manufacturing the mounting structure shown in FIG. 1(*a*)
Figure 4:
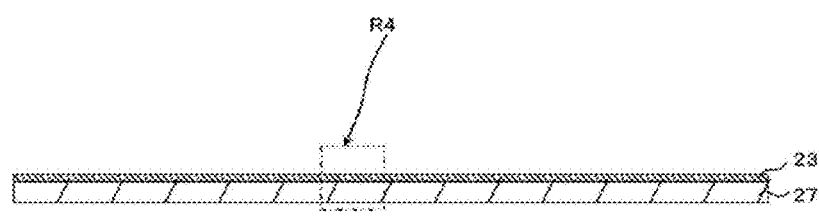
Figure 5:
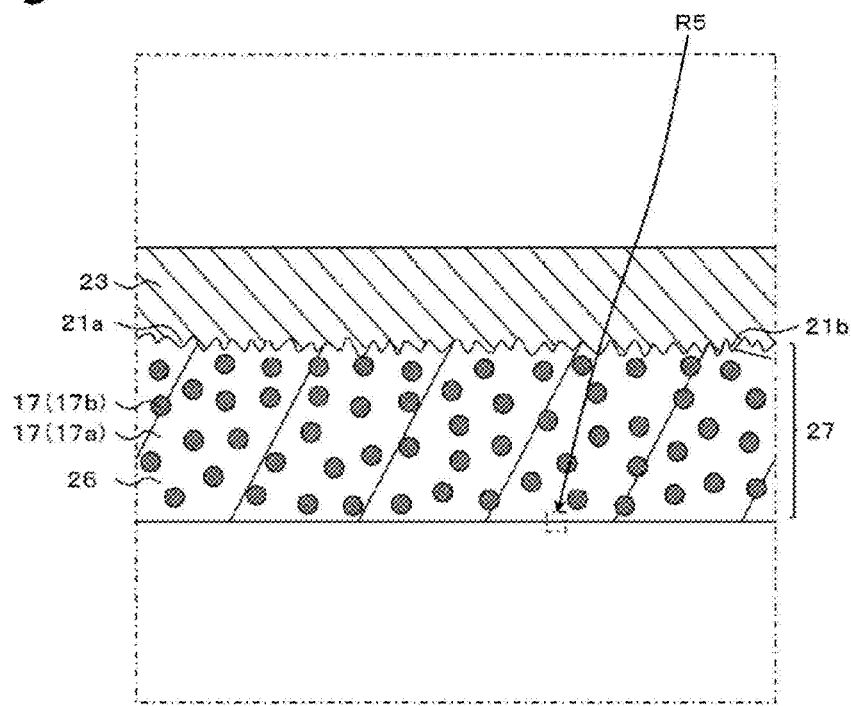
FIG. 5(*a*) is an enlarged sectional view of an R4 portion in FIG. 4(*b*), and FIG. 5(*b*) is an enlarged sectional view of an R5 portion in FIG. 5(*a*)
Figure 5:
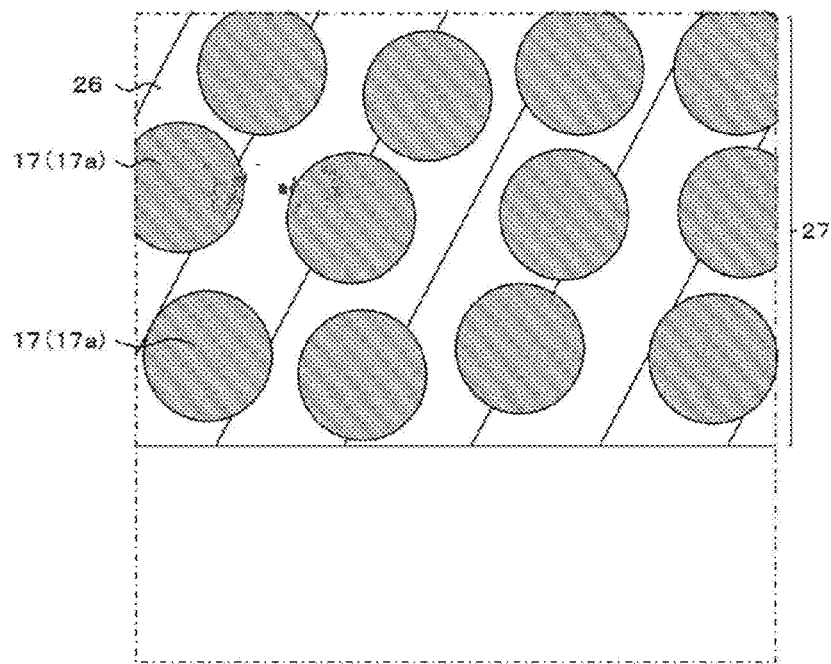
Figure 6:
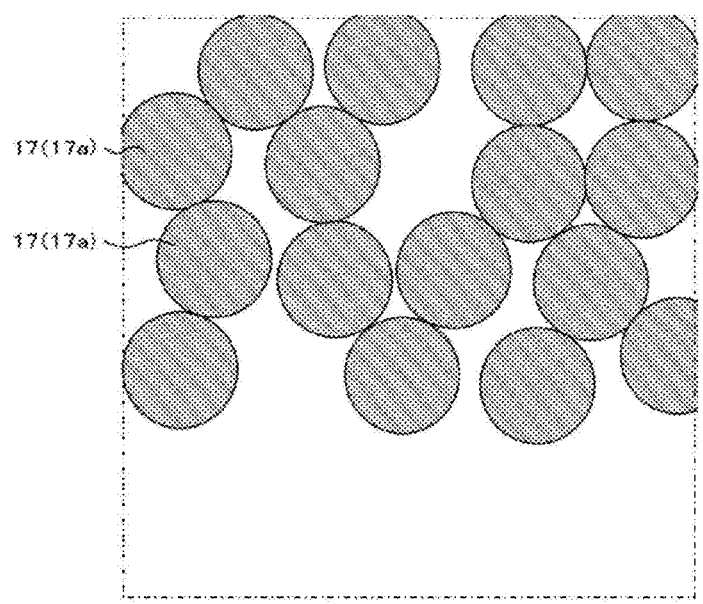
FIG. 6(*a*) is an enlarged sectional view of a portion corresponding to FIG. 5(*b*), which shows the process of manufacturing the mounting structure shown in FIG. 1(*a*), and FIG. 6(*b*) is a sectional view illustrating the process of manufacturing the mounting structure shown in FIG. 1(*a*)
Figure 6:
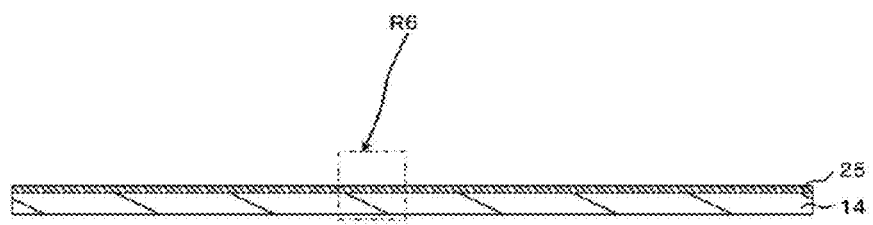
Figure 7:
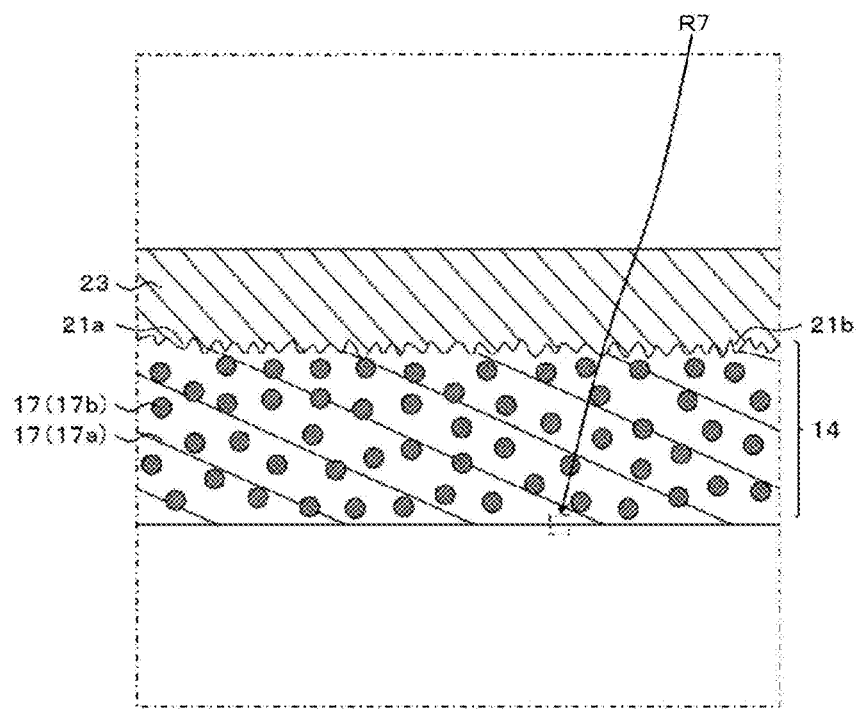
FIG. 7(*a*) is an enlarged sectional view of an R6 portion in FIG. 6(*b*), and FIG. 7(*b*) is an enlarged sectional view of an R7 portion in FIG. 7(*a*)
Figure 7:
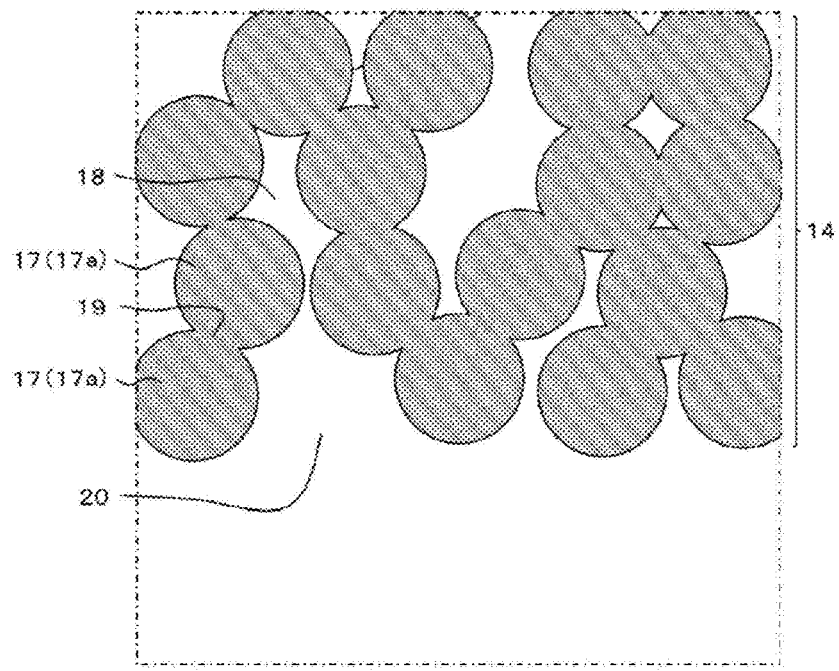

1(b) and FIG. 3. The part of one main surface of the inorganic insulating layer 14 has plural first recessed portions 21a each of which has at least partially circular shape in a plan view. Part of the conductive layer 11 enters into the plural first recessed portions 21a.

As a result, since the part of the conductive layer 11 enters into the first recessed portions 21a, a bonding strength between the conductive layer 11 and the inorganic insulating layer 14 can be improved by an anchor effect. Thus, it is possible to suppress separation of the conductive layer 11 and the inorganic insulating layer 14. Further, since the first recessed portions 21a each have the at least partially circular shape in a plan view, the stress applied between the conductive layer 11 and the inorganic insulating layer 14 is distributed in the first recessed portions 21a. Thus, it is possible to suppress the occurrence of the cracks in the inorganic insulating layer 14 due to the stress, and to suppress separation between the conductive layer 11 and the inorganic insulating layer 14 due to the cracks. Accordingly, it is possible to obtain the wiring board 3 capable of suppressing disconnection of the conductive layer 11 and having excellent electric reliability.

In the present embodiment, the plural first recessed portions 21a each of which has the at least partially circular shape in a plan view have a shape formed by one circle or a shape formed by connection of plural circles in a plan view.

The width of the first recessed portion 21a in a plan view is 0.2 μm or more and 10 μm or less, for example. Further, the curvature radius of the circular part of the first recessed portion 21a in a plan view is 0.1 μm or more and 3 μm or less, for example. The depth of the first recessed portion 21a in a sectional view in the thickness direction is 0.2 μm or more and 5 μm or less, for example.

The shape of the first recessed portion 21a in a plan view may be checked as follows, for example. First, the conductive layer 11 is exposed by cutting one main surface of the wiring board 3 by buffing, using sand paper, or the like. Then, the conductive layer 11 is removed using a ferric chloride solution, a copper chloride solution, or the like to expose one main surface of the inorganic insulating layer 14. Then, the exposed one main surface is observed by a scanning electron microscope.

Further, the width of the first recessed portion 21a in a plan view may be obtained as follows, for example. First, one main surface of the inorganic insulating layer 14 is exposed and observed as described above, and then, the width of the first recessed portion 21a is measured. Then, an average value of the measured values is calculated.

Further, the curvature radius of the circular part of the first recessed portion 21a in a plan view may be calculated as follows, for example. First, one main surface of the inorganic insulating layer 14 is exposed and observed as described above, and then, the curvature radius of the circular part is measured. Then, an average value of the measured values is calculated.

Further, the depth of the first recessed portion 21a in the sectional view in the thickness direction may be calculated as follows, for example. First, a section obtained by cutting the wiring board 3 in the thickness direction is observed by a scanning electron microscope, and then the depth of the first recessed portion 21a is measured. Then, an average value of the measured values is calculated.

Further, as shown in FIG. 1(b), the wiring board 3 of the present embodiment further includes the first resin layer 13a that is disposed on another part of the one main surface of the inorganic insulating layer 14 and covers side surfaces of the conductive layer 11 and one main surface of the conductive layer 11 on a side opposite to the inorganic insulating layer 14. The other part of the one main surface of the inorganic insulating layer 14 includes plural second recessed portions 21b each of which has at least partially circular shape in a plan view. Part of the first resin layer 13a enters into the plural second recessed portions 21b.

The first resin layer 13a can fix the conductive layer 11 to the inorganic insulating layer 14 by covering the side surfaces of the conductive layer 11 and the one main surface thereof on the side opposite to the inorganic insulating layer 14. Further, since the part of the first resin layer 13a enters into the plural second recessed portions 21b, a bonding strength between the first resin layer 13a and the inorganic insulating layer 14 can be improved. Thus, it is possible to increase a force for fixing the conductive layer 11 by the first resin layer 13a. Accordingly, it is possible to improve a bonding strength between the conductive layer 11 and the inorganic insulating layer 14, and to suppress separation between the conductive layer 11 and the inorganic insulating layer 14. Further, since the second recessed portions 21b each have the at least partially circular shape in a plan view, stress applied between the first resin layer 13a and the inorganic insulating layer 14 is distributed in the second recessed portions 21b. Thus, it is possible to reduce the occurrence of the cracks of the inorganic insulating layer 14 due to the stress, and to suppress separation of the first resin layer 13a and the inorganic insulating layer 14 due to the cracks. The shape of the second recessed portion 21b is the same as the shape of the first recessed portion 21a.

Further, as shown in FIG. 2(a) and FIG. 2(b), the wiring board 3 of the present embodiment includes the second resin layer 13b that is disposed on the other main surface of the inorganic insulating layer 14. The inorganic insulating layer 14 includes the plural first inorganic insulating particles 17a, and the respective first inorganic insulating particles 17a are partly connected to each other. Part of the second resin layer 13b enters into the gap 18 of the plural first inorganic insulating particles 17a.

In this way, since the plural first inorganic insulating particles 17a are partly connected to each other and the part of the second resin layer 13b enters into the gap 18 of the plural first inorganic insulating particles 17a, as described above, it is possible to provide the inorganic insulating layer 14 with a high rigidity and a low thermal expansion coefficient, and to suppress the occurrence of the cracks in the inorganic insulating layer 14. Further, since the part of the second resin layer 13b enters into the gap 18 of the plural inorganic insulating particles 17, it is possible to improve the bonding strength between the second resin layer 13b and the inorganic insulating layer 14. Accordingly, it is possible to suppress separation of the second resin layer 13b and the inorganic insulating layer 14. Thus, when heat is applied to the wiring board 3 when the electronic component 2 is mounted or operated, it is possible to suppress moisture included in the wiring board 3 from being expanded in a separated portion, and to suppress occurrence of cracks due to the moisture expansion in the separated portion. As a result, it is possible to suppress disconnection of the conductive layer 11 due to the cracks or short-circuiting due to ion migration.

In the inorganic insulating layer 14, since the plural first inorganic insulating particles 17a are partly connected to each other, when the stress is applied to the inorganic insulating layer 14, cracks easily occur in the connecting portion 19 between the first inorganic insulating particles 17a.

On the other hand, in the wiring board 3 of the present embodiment, as described above, since the first recessed portions 21a each have the at least partially circular shape in a plan view and the stress applied between the conductive layer 11 and the inorganic insulating layer 14 is distributed in the first recessed portions 21a, it is possible to suppress occurrence of cracks in the connecting portion 19 between the first inorganic insulating particles 17a.

Further, as shown in FIG. 1(*b*), the inorganic insulating layer 14 of the present embodiment includes the plural second inorganic insulating particles 17b having a particle diameter larger than that of the first inorganic insulating particles 17a, the respective second inorganic insulating particles 17b are partly connected to the first inorganic insulating particles 17a, and the second inorganic insulating particles 17b being separated from each other with the first inorganic insulating particles 17a interposed therebetween. Regions between the first recessed portions 21a in the inorganic insulating layer 14 are composed of only the first inorganic insulating particles 17a among the first inorganic insulating particles 17a and the second inorganic insulating particles 17b.

As a result, since the inorganic insulating layer 14 includes the second inorganic insulating particles 17b, as described above, it is possible to reduce extension of the cracks in the inorganic insulating layer 14. Further, the regions between the first recessed portions 21a in the inorganic insulating layer 14 are composed of only the first inorganic insulating particles 17a among the first inorganic insulating particles 17a and the second inorganic insulating particles 17b, it is possible to make an inner surface of the first recessed portion 21a smooth. Accordingly, since the stress applied between the conductive layer 11 and the inorganic insulating layer 14 is distributed in the first recessed portions 21a, it is possible to reduce the occurrence of the cracks in the connecting portion 19 between the first inorganic insulating particles 17a.

On the other hand, in the wiring board 3 of the present embodiment, at least one first recessed portion 21a has a shape in which plural circles are connected to each other in a plan view. As a result, it is possible to increase the area of one first recessed portion 21a in the main surface direction, and thus, it is possible to increase the area of part of the conductive layer 11 disposed in the first recessed portions 21a in the main surface direction, which makes cutting thereof difficult. Thus, it is possible to improve the bonding strength between the conductive layer 11 and the inorganic insulting layer 14. Further, it is possible to increase the area of one recessed portion 21a in the main surface direction. Thus, a plating solution easily enters into the first recessed portion 21a when forming the conductive layer 11, to thereby make possible to preferably spread part of the conductive layer 11 into the first recessed portions 21a. Further, it is possible to distribute the stress between the conductive layer 11 and the inorganic insulating layer 14 in the circular portion in a plan view, and to improve the bonding strength between the conductive layer 11 and the inorganic insulating layer 14 by the anchor effect due to irregularities generated in the portion where the plural circles are connected to each other in a plan view.

Further, in the wiring board 3 of the present embodiment, at least one first recessed portion 21a has the shape in which the plural circles are connected to each other in one direction in a plan view. As a result, it is possible to improve the bonding strength between the conductive layer 11 and the inorganic insulating layer 14.

Further, in the wiring board 3 of the present embodiment, an average crystalline particle diameter in the part of the conductive layer 11 that enters into the first recessed portions 21a is smaller than an average crystalline particle diameter in another part of the conductive layer 11. As a result, the parts that enter into the first recessed portion 21a of the conductive layer 11 is easily deformed compared with another part of the conductive layer 11. Thus, it is possible to alleviate the stress between the conductive layer 11 and the inorganic insulating layer 14 in the first recessed portions 21a, and to reduce the occurrence of the cracks in the inorganic insulating layer 14.

Further, the content ratio of the first filler particles 16a in a region (first proximity region 22a) of the first resin layer 13a close to the inorganic insulating layer 14 is smaller than the content ratio of the second filler particles 16b in a region (second proximity region 22b) of the second resin layer 13b close to the inorganic insulating layer 14.

As a result, in the first proximity region 22a, by reducing the content ratio of the first filler particles 16a, it is possible to improve filling efficiency of the resin 15 between the conductive layers 11 adjacent to each other in the main surface direction. Thus, it is possible to increase the wiring density by reducing the pitch of the conductive layers 11 while improving an insulation characteristic between the conductive layers 11 and suppress short-circuiting of the conductive layers 11. Further, as described above, since the part of the first resin layer 13a enters into the second recessed portions 21b, it is possible to improve the bonding strength between the first resin layer 13a and the inorganic insulating layer 14. Thus, it is possible to reduce separation between the first resin layer 13a and the inorganic insulating layer 14.

On the other hand, in the second proximity region 22b, by increasing the content ratio of the second filler particle 16b, it is possible to reduce a thermal, expansion coefficient difference between the second resin layer 13b and the inorganic insulating layer 14. Thus, it is possible to reduce the thermal stress applied between the second resin layer 13b and the inorganic insulating layer 14, and to reduce separation between the second resin layer 13b and the inorganic insulating layer 14.

The first proximity region 22a is a region within 20% of the thickness of the first resin layer 13a from one main surface of the inorganic insulating layer 14. The second proximity region 22b is a region within 20% of the thickness of the second resin layer 13b from the other main surface of the inorganic insulating layer 14. The thickness of the first proximity region 22a is smaller than the thickness of the conductive layer 11, and the thickness of the second proximity region 22b is the same as the thickness of the first proximity region 22a. The content ratio of the first filler particles 16a in the first proximity region 22a is 55 vol % or more and 85 vol % or less, for example. Further, the content ratio of the second filler particles 16b in the second proximity region 22b is 80 vol % or more and 90 vol % or less, for example.

Further, the content ratio of the first filler particles 16a in the first proximity region 22a of the first resin layer 13a is smaller than the content ratio of the first filler particles 16a in a region (third proximity region 22c) of the first resin layer 13a that is close to the other inorganic insulating layer 14 disposed on a side opposite to the core substrate 5. As a result, the same effects as in the above-described first proximity region 22a and the second proximity region 22b are obtained.

The thickness of the third proximity region 22c is the same as the thickness of the second proximity region 22b. Further, the content ratio of the first filler particles 16a in the third proximity region 22c is the same as the content ratio of the second filler particles 16b in the second proximity region 22b. Further, the content ratio of the first filler particles 16a in a region (remaining region 22d) other than the first proximity region 22a and the third proximity region 22c in the first resin layer 13a is the same as the content ratio of the first filler particles 16a in the first proximity region 22a.

Next, a method for manufacturing the above-described mounting structure 1 will be described with reference to FIG. 4 to FIG. 11.

(1) As shown in FIG. 4(a), the core substrate 5 is manufactured. Specifically, the core substrate 5 is manufactured as follows, for example.

A laminated plate formed of a base 7 formed by curing a prepreg, and a metal foil such as copper disposed on upper and lower surfaces of the base 7 is prepared. Then, through holes are formed in the laminated plate using sandblasting, laser processing or drilling. Then, for example, a conductive material is deposited in the through hole using electroless plating, electrolytic plating, vapor deposition, CVD, sputtering, or others to form a through hole conductor 8. Then, a non-cured resin is supplied into the through hole conductor 8 and is then cured to form the insulator 9. Then, for example, a conductive material is deposited on the insulator 9 using electroless plating, electrolytic plating, vapor deposition, CVD, sputtering, or others, and then, the metal foil and the conductive material on the base 7 are patterned using photolithography, etching, or others to form the conductive layer 11. As a result, the core substrate 5 can be manufactured.

(2) As shown in FIG. 4(b) to FIG. 8(b), a laminated sheet 25 including a support 23 formed of a metal foil such as a copper foil, or the like, an inorganic insulating layer 14 disposed on the support 23, and a resin layer precursor 24 which is disposed on the inorganic insulating layer 14 and is not cured is manufactured. Specifically, the laminated sheet 25 is manufactured as follows, for example.

Figure 8:
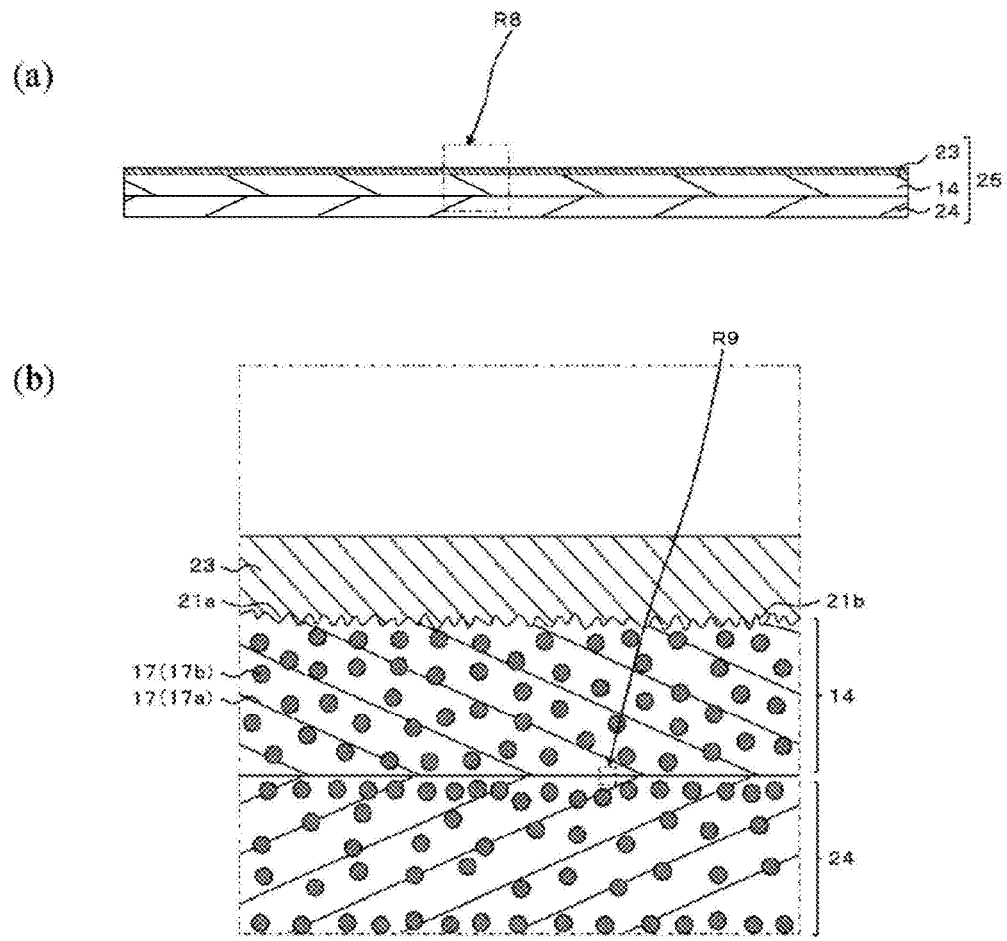
FIG. 8(*a*) is a sectional view illustrating the process of manufacturing the mounting structure shown in FIG. 1(*a*), and FIG. 8(*b*) is an enlarged sectional view of an R8 portion in FIG. 8(*a*)
Figure 9:
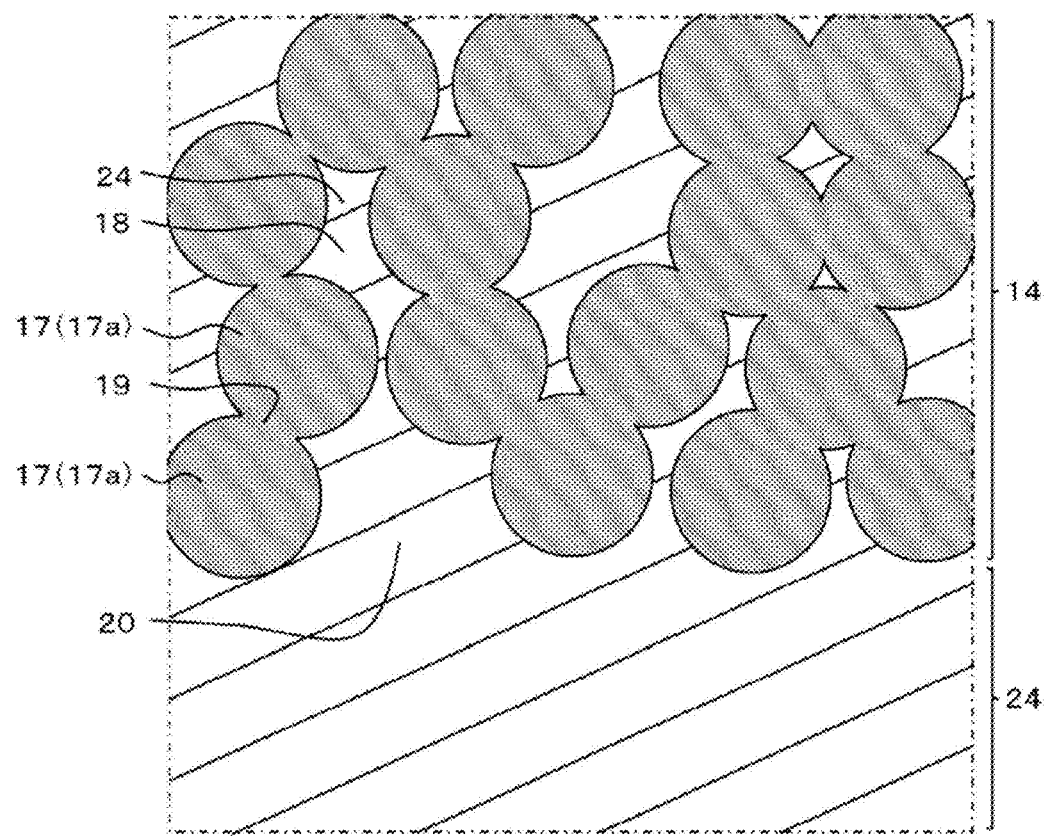
FIG. 9 is an enlarged sectional view of an R9 portion in FIG. 8(*b*)
Figure 10:
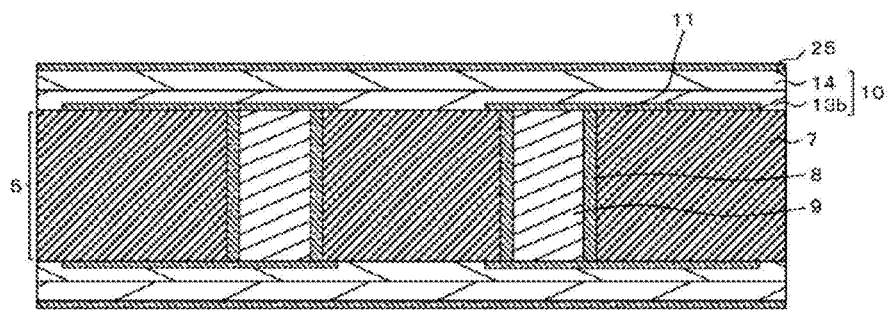
FIG. 10(*a*) and FIG. 10(*b*) are sectional views illustrating a process of manufacturing the mounting structure shown in FIG. 1 (*a*)
Figure 10:
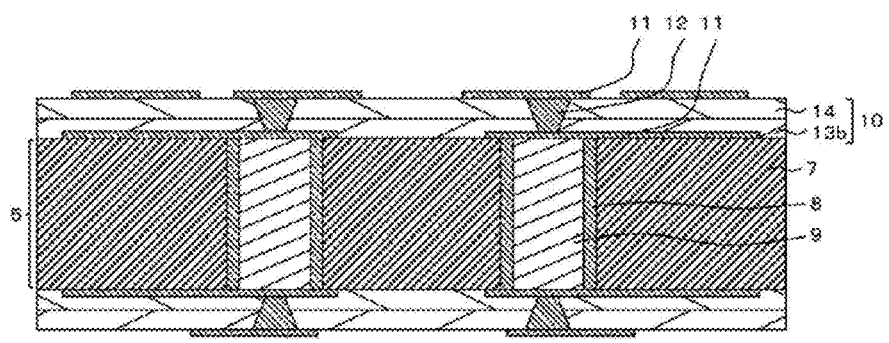
Figure 11:
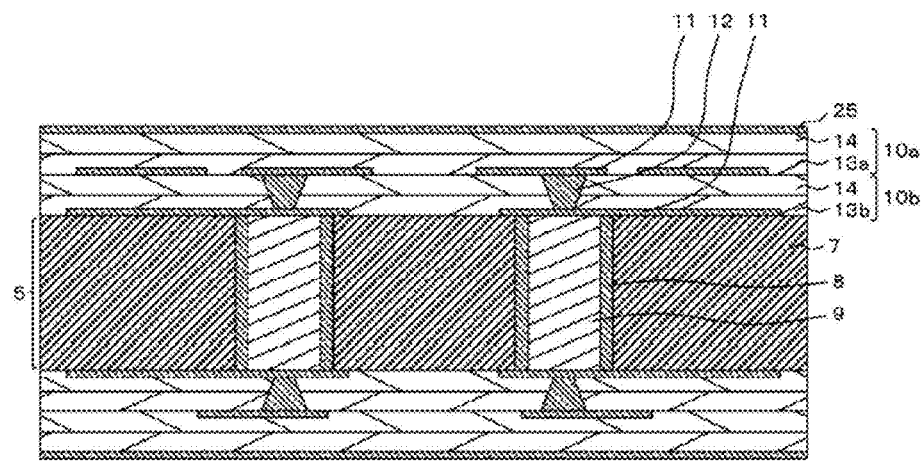
FIG. 11(*a*) and FIG. 11(*b*) are sectional views illustrating the process of manufacturing the mounting structure shown in FIG. 1(*a*)
Figure 11:
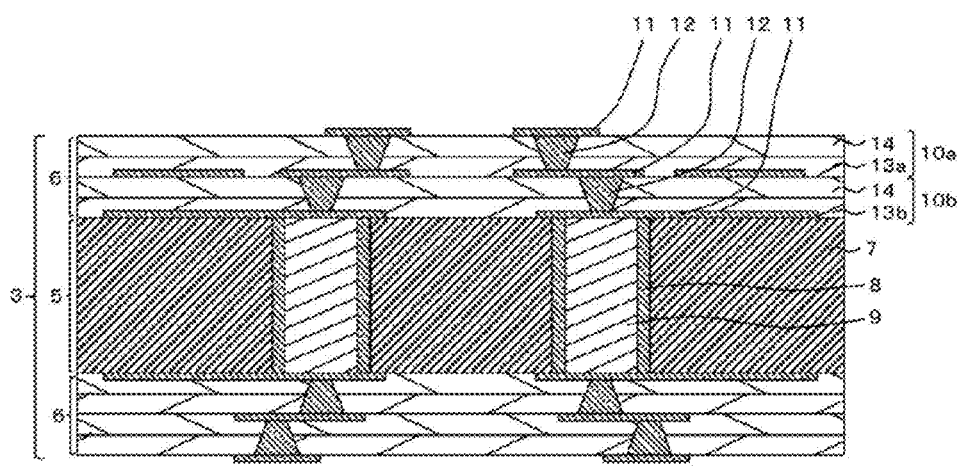

First, as shown in FIG. 4(b) to FIG. 5(b), an inorganic insulation sol 27 including the inorganic insulating particles 17 and a solvent 26 in which the inorganic insulating particles 17 are dispersed is prepared, and the inorganic insulation sol 27 is coated onto one main surface of the support 23. Then, as shown in FIG. 6(a), the solvent 26 is evaporated from the inorganic insulation sol 27, so that the inorganic insulating particles 17 remain on the support 23. The remaining inorganic insulation particles 17 are in contact with each other in a proximity portion therebetween. Then, as shown in FIG. 6(b) and FIG. 7(b), the inorganic insulating particles 17 are heated to connect the adjacent inorganic insulating particles 17 in the proximity portion, so that the inorganic insulating layer 14 is formed. Then, as shown in FIG. 8(a) to FIG. 9, the resin layer precursor 24 is laminated on the inorganic insulating layer 14, and the laminated inorganic insulating layer 14 and the resin layer precursor 24 are heated and pressed in the thickness direction, so that part of the resin layer precursor 24 is inserted into the gap 18. As a result, the staked sheet 25 can be manufactured.

Here, in the present embodiment, the support 23 includes plural protruding portions 28 on one main surface thereof where the inorganic insulation sol 27 is to be coated. The inorganic insulation sol 27 is coated on one main surface having the plural protruding portions 28, the solvent 26 is evaporated, and then, the inorganic insulating particles 17 are connected to each other to form the inorganic insulating layer 14. Thus, it is possible to form the first recessed portions 21a and the second recessed portions 21b corresponding to the protruding portions 28 in the inorganic insulating layer 14.

The plural protruding portions 28 have shapes corresponding to the above-described first recessed portions 21a and the second recessed portions 21b. That is, the plural protruding portions 28 each have at least partially circular shape in a plan view. Further, at least one of the protruding portions 28 has a shape in which the plural circles are connected to each other in a plan view. In addition, at least one of the protruding portions 28 has a shape in which the plural circles are connected to each other in one direction in a plan view. The support 23 having the protruding portions 28 is appropriately selected from supports of various shapes.

The content ratio of the inorganic insulating particles 17 in the inorganic insulation sol 27 is 10 vol % or more and 50 vol % or less, for example. The content ratio of the solvent 26 in the inorganic insulation sol 27 is 50 vol % or more and 90 vol % or less, for example. The solvent 26 may use an organic solvent containing methanol, isopropanol, methyl ethyl ketone, methyl isobutyl ketone, xylene, or a mixture including two or more types of components selected from the above components, for example.

A heating temperature when the inorganic insulating particles 17 are connected to each other is equal or higher than a boiling point of the solvent 26 and is lower than a crystalline starting temperature of the inorganic insulating particles 17, and specifically, 100° C. or higher and 250° C. or lower. Further, the heating time is 0.5 hour or longer and 24 hours or shorter, for example.

As described above, the first inorganic insulating particles 17a of the present embodiment have a fine average particle diameter of 3 nm or more and 110 nm or less. Thus, even at such a low temperature, it is possible to strongly connect the first inorganic insulating particles 17a to each other, and the first inorganic insulating particles 17a and the second inorganic insulating particles 17b. The reason is estimated as follows. That is, atoms of the first inorganic insulating particles 17a, particularly, atoms on the surface actively move since the first inorganic insulating particles 17a are fine, and thus, the first inorganic insulating particles 17a are strongly connected to each other, and the first inorganic insulating particles 17a and the second inorganic insulating particles 17b are strongly connected to each other, at such a low temperature.

Further, by performing heating at such a low temperature, it is possible to connect the first inorganic insulating particles 17a to each other, and the first inorganic insulating particles 17a and the second inorganic insulating particles 17b in only the proximity portion while maintaining the particle shapes of the first inorganic insulating particles 17a and the second inorganic insulating particles 17b. As a result, it is possible to form the neck-like structure in the connecting portion 19 and to easily form the gap 18 of the open pore. The temperature at which the first inorganic insulating particles 17a can be strongly connected to each other is about 250° C. when the average particle diameter of the first inorganic insulating particles 17a is set to 110 nm or smaller, and is about 150° C. when the average particle diameter of the first inorganic insulating particles 17a is set to 15 nm or smaller.

The pressure applied when the laminated inorganic insulating layer 14 and the resin layer precursor 24 are heated and pressed is 0.5 MPa or more and 2 MPa or less, for example. The pressing time is 60 seconds or longer and 10 minutes or shorter, for example. The heating temperature is 80° C. or higher and 140° C. or lower, for example. Since the heating temperature is lower than the curing starting temperature of the resin layer precursor 24, the resin layer precursor 24 may be maintained in an uncured state.

Further, when part of the resin layer precursor 24 is inserted into the gap 18, if the average particle diameter of the first inorganic insulating particles 17a is larger than the average particle diameter of the filler particles 16, the filler particles 16 do not easily enter into the gap 18. Thus, the filler particles 16 are concentrated in a region that is close to a boundary between the resin layer precursor 24 and the inorganic insulating layer 14.

(3) As shown in FIG. 10(a) and FIG. 10(b), the laminated sheet 25 is laminated on the core substrate 5 to form the insulating layer 10, and then, the conductive layer 11 and the via conductor 12 are formed on the insulating layer 10. Specifically, the process is performed as follows, for example.

First, as shown in FIG. 10(a), the laminated sheet 25 is laminated on the core substrate 5 while making the resin layer precursor 24 close to the core substrate 5. Then, the laminated core substrate 5 and the laminated sheet 25 are heated and pressed in the thickness direction, so that the laminated sheet 25 is bonded to the core substrate 5. Then, the resin layer precursor 24 of the laminated sheet 25 is heated at a temperature equal to or higher than the curing starting temperature and lower than a thermal decomposition temperature, and then, the resin layer precursor 24 is cured to form the resin layer 13. As a result, it is possible to form the insulating layer 10 including the resin layer 13 and the inorganic insulating layer 14 included in the laminated sheet 25 on the core substrate 5.

Then, as shown in FIG. 10(b), the support 15 is chemically separated from the inorganic insulating layer 14 by using a ferric chloride solution, a copper chloride solution, or the like. Then, via holes that penetrate the insulating layer 10 in the thickness direction and expose the conductive layer 11 are formed using laser processing, or the like. Then, smear (resin residue) generated in the via holes due to the laser processing is removed (desmearing) by a plasma desmearing method. Then, a conductive layer 11 of a desired pattern is formed on the insulating layer 10 by a semi-additive method using the electroless plating, the electrolytic plating, or the like, a subtractive method, a full-additive method, or the like to form the via conductor 12 in the via hole. Here, the conductive layer 11 is disposed on part of one main surface of the inorganic insulating layer 14 in the insulating layer 10.

The resin layer 13 formed by curing the resin layer precursor 24 in this process becomes the second resin layer 13b that is disposed on the other main surface of the inorganic insulating layer 14 included in the laminated sheet 25 on the side of the core substrate 5. Further, part of the resin layer precursor 24 that enters into the gap 18 in the process (2) becomes part of the second resin layer 13b that enters into the gap 18 in this process. In addition, the region close to the boundary between the resin layer precursor 24 and the inorganic insulating layer 14 where the filler particles 16 are concentrated in the process (2) becomes the second proximity area 22b in this process. Respective conditions when the laminated core substrate 5 and the laminated sheet 25 are heated and pressed are the same as in the heating and pressing in the process (2).

Here, in the present embodiment, as the support 15 is separated from the inorganic insulating layer 14, the first recessed portions 21a and the second recessed portions 21b that are formed in the process (2) are exposed. Further, the conductive layer 11 is formed on one main surface of the inorganic insulating layer 14 where the first recessed portions 21a are exposed. Here, since the plating solution enters into the first recessed portion 21a, part of the conductive layer 11 is in a state of entering into the first recessed portion 21a.

When performing the desmearing, if a general wet desmearing method using a chemical solution such as a permanganate solution is used, the one main surface of the inorganic insulating layer 14 that contacts the chemical solution, the surface of the inorganic insulating layer 14 and part of the second resin layer 13b disposed in the gap 18 are dissolved and removed. Thus, the first recessed portion 21a and the second recessed portion 21b are easily lost.

On the other hand, in the present embodiment, since the plasma desmearing method is used, the one main surface of the inorganic insulating layer 14, the surface of the inorganic insulating layer 14 and part of the second resin layer 13b disposed in the gap 18 are not easily removed. Thus, it is possible to make the first recessed portions 21a and the second recessed portions 21b remain on one main surface of the inorganic insulating layer 14. The plasma desmearing method is performed by RF plasma or microwave plasma using oxygen, nitrogen, argon, carbon tetrafluoride ($CF_4$), or the like as a raw material, for example, and the processing time is 2 minutes or longer and 30 minutes or shorter, for example.

Further, in the present embodiment, the conductive layer 11 is formed on one main surface of the inorganic insulating layer 14 using an electroless plating method and an electrolytic plating method. In this way, if the conductive material is deposited by the plating methods, the average crystalline particle diameter increases as the conductive material is deposited. Accordingly, the average crystalline particle diameter in the part of the conductive layer 11 that enters into the first recessed portion 21a can become smaller than the average crystalline particle diameter in another part of the conductive layer 11.

(4) As shown in FIG. 11(a) and FIG. 11(b), the laminated sheet 25 is laminated on the insulating layer 10 to further form the insulating layer 10. By forming the conductive layer 11 and the via conductor 12 on the insulating layer 10, the build-up layer 6 is formed on the core substrate 5 to manufacture the wiring board 3. Specifically, the process is performed as follows, for example. Here, for ease of description, the insulating layer 10 formed in this process is represented as a first insulting layer 10a, and the insulating layer 10 formed in the process (3) is represented as a second insulating layer 10b.

First, as shown in FIG. 11(a), the laminated sheet 25 is laminated on the second insulating layer 10b while bringing the resin layer precursor 24 in contact with the second insulating layer 10b. Then, the laminated second insulating layer 10b and the laminated sheet 25 are heated and pressed in the thickness direction, whereby the laminated sheet 25 is bonded to the second insulating layer 10b. Then, the resin layer precursor 24 of the laminated sheet 25 is heated at a temperature equal to or higher than the curing starting temperature and lower than the thermal decomposition temperature, whereby the resin layer precursor 24 is cured to form the resin layer 13. As a result, the first insulating layer 10a having the resin layer 13 and the inorganic insulating layer 14 included in the laminated sheet 25 can be formed on the second insulating layer 10b.

Next, as shown in FIG. 11(b), the conductive layer 11 and the via conductor 12 are formed on the first insulating layer 10a by the same method as in the process (3). By repeating this process, the build-up layer 6 can be formed multiple times.

The resin layer 13 formed by curing the resin layer precursor 24 in this process becomes the first resin layer 13a disposed on one main surface of the inorganic insulating layer 14 included in the second insulating layer 10b on the side opposite to the core substrate 5. Further, when the laminated sheet 25 is bonded to the second insulating layer 10b, since the resin layer precursor 24 flows, the resin layer precursor 24 is disposed in the other part of one main surface of the inorganic insulating layer 14, and covers side surfaces and one main surface of the conductive layer 11. Accordingly, the first resin layer 13a covers the side surfaces and one main surface of the conductive layer 11 disposed on one main surface of the inorganic insulating layer 14. Respective conditions when the laminated second insulating layer 10b and the laminated sheet 25 are heated and pressed are the same as in the heating and pressing of the process (2).

Here, in the present embodiment, when the laminated second insulating layer 10b and the laminated sheet 25 are heated and pressed in the thickness direction, part of the resin layer precursor 24 enters into the second recessed portions 21b exposed on one main surface of the inorganic insulating layer of the second insulating layer 10b. Further, as the part of the resin layer precursor 24 is cured, part of the first resin layer 13a is in a state of entering into the second recessed portions 21b.

(5) By flip-chip-mounting the electronic component 2 on the wiring board 3 through the bump 4, the mounting structure 1 shown in FIG. 1(a) is manufactured. The electronic component 2 may be electrically connected to the wiring board 3 through wire bonding, or may be built in the wiring board 3.

The invention is not limited to the above-described embodiments, and various modifications, improvements, combinations, and so on are possible without departing from the scope of the invention.

Further, in the above-described embodiments of the invention, the build-up multilayer board formed by the core substrate 5 and the build-up layer 6 is used as an example of the wiring board 3, but a board other than the build-up multilayer board may be used as the wiring board 3, and for example, a coreless board may be used.

Further, in the above-described embodiments of the invention, a configuration in which the inorganic insulating layer 14 is used in the build-up layer 6 is described as an example, but the inorganic insulating layer 14 may be used in the base 7. In this case, the base 7 includes the second resin layer 13b and the inorganic insulating layer 14. The build-up layer 6 includes the conductive layer 11 and the first resin layer 13a disposed on the inorganic insulating layer 14. Part of the conductive layer 11 enters into the first recessed part 21a of the inorganic insulating layer 14.

Further, in the above-described embodiment of the invention, a configuration in which one build-up layer 6 includes two insulating layers 10 is described as an example, but one build-up layer 6 may include three or more insulting layers 10. In this case, in each insulating layer 10, part of the conductive layer 11 may enter into the first recessed portion 21a of the inorganic insulating layer 14.

In addition, in the above-described embodiments of the invention, the inorganic insulating particles 17 includes the first inorganic insulating particles 17a and the second inorganic insulating particles 17b, but the inorganic insulating particles 17 may include only the first inorganic insulating particles 17a.

Further, in the above-described embodiments of the invention, the evaporation of the solvent 26 and the heating of the inorganic insulating particles 17 in the process (2) are separately performed, but the evaporation and the heating may be performed at the same time.

EXAMPLE

Hereinafter, an example of the invention will be described in detail, but the invention is not limited to the example, and modifications or other examples in a range without departing from the spirit of the invention are included in the scope of the invention.

(Evaluation Method)

A laminated sheet including a copper foil (support) having protruding portions on one main surface, an inorganic insulating layer disposed on the copper foil, and a resin layer disposed on the inorganic insulating layer was manufactured. Then, the copper foil was separated from the laminated sheet. Then, desmearing was performed on one main surface of the inorganic insulating layer by various methods. Then, the one main surface of the inorganic insulating layer was observed by a scanning electron microscope.

(Manufacturing Condition of Laminated Sheet)

First, as the copper foil having the protruding portions each having at least partially circular shape in a plan view on one main surface thereof, "3EC-VLP" made by Mitsui Mining and Smelting Co., Ltd was prepared.

Then, an inorganic insulation sol including first inorganic insulating particles made of silicon oxide and having an average particle diameter of 10 nm to 80 nm, second inorganic insulating particles made of silicon oxide and having an average particle diameter of 0.7 μm to 2 μm, and a solvent including methyl isobutyl ketone was manufactured.

Then, the inorganic insulation sol was coated on the copper foil.

Then, the inorganic insulation sol was heated while evaporating the solvent at a temperature of 150° C. for two hours under an atmospheric condition, so that the inorganic insulating layer having recessed portions of a shape corresponding to the protruding portions was manufactured on one main surface of the copper foil.

Then, a resin layer precursor including an uncured epoxy resin is laminated on the other main surface side of the inorganic insulating layer on a side opposite to the copper foil. The laminated body was heated and pressed under conditions of 1 hour, a pressure of 3 MPa, and a temperature of 180° C., so that a laminated sheet including the copper foil, the inorganic insulating layer, and the resin layer was manufactured.

Then, the copper foil was etched using a ferric chloride solution to be removed from the laminated sheet, so that one main surface of the inorganic insulating layer was exposed.

Then, via holes penetrating the inorganic insulating layer and the resin layer were formed in the thickness direction using laser processing. Then, the result that was not subjected to subsequent desmearing was set to sample 1.

Then, samples 2 and 3 were manufactured by performing desmearing with respect to one main surface of the inorganic insulating layer and the via holes under various conditions. The desmearing of sample 2 was performed under conditions where a chemical solution was a permanganate solution, a processing temperature was 85° C., and a processing time was 15 minutes by using the wet desmearing method. The desmearing of sample 3 was performed under conditions where a raw material gas was $CF_4$ and the type of plasma was microwave plasma, using a plasma desmearing method.

(Result)

Figure 12:
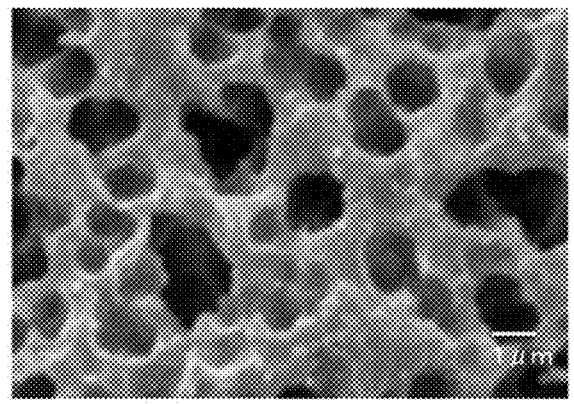
FIG. 12(*a*) is a photo obtained by imaging one main surface of an inorganic insulating layer in sample 1 of an example by a scanning electron microscope, FIG. 12(*b*) is a photo obtained by imaging one main surface of an inorganic insulating layer in sample 2 of the example by a scanning electron microscope, and FIG. 12(*c*) is a photo obtained by imaging one main surface of an inorganic insulating layer in sample 3 of the example by a scanning electron microscope.
Figure 12:
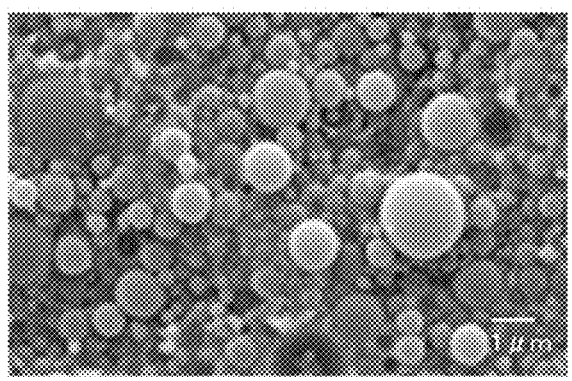
Figure 12:
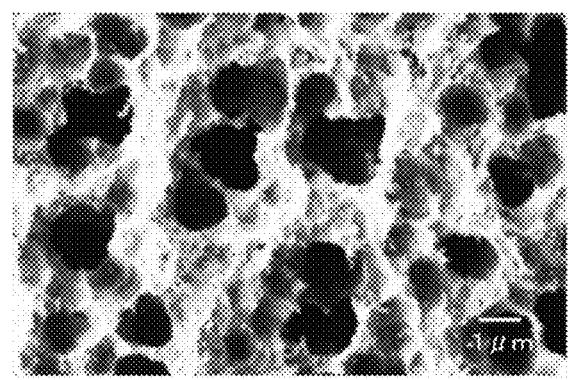

As a result obtained by observing one main surface of the inorganic insulating layer, as shown in FIG. 12(a), recessed portions having an at least partially circular shape in a plan view was formed in sample 1, but as shown in FIG. 12(b), the recessed portions were lost in sample 2. On the other hand, as shown in FIG. 12(c), the recessed portions remained in sample 3. Further, while smear remained in the via holes in sample 1, the smear generated in the via holes was removed in samples 2 and 3.

As described above, it was confirmed that, as the inorganic insulating layer was formed on the copper foil in which the protruding portions were formed, the recessed portions having the at least partially circular shape in a plan view were formed on one main surface of the inorganic insulating layer, and the recessed portions remained even though desmearing was performed using the plasma smearing method.

REFERENCE SIGNS LIST

1: Mounting structure
2: Electronic component
3: Wiring board
4: Bump
5: Core substrate
6: Build-up layer
7: Base
8: Through hole conductor
9: Insulator
10: insulating layer
11: Conductive layer
12: Via conductor
13: Resin layer
13a: First resin layer
13b: Second resin layer
14: Inorganic insulating layer
15: Resin
15a: First resin
15b: Second resin
16: Filler particle
16a: First filler particle
16b: Second filler particle
17: Inorganic insulating particle
17a: First inorganic insulating particle
17b: Second inorganic insulating particle
18: Gap
19: Connecting portion between the plural inorganic insulating particles
20: Opening
21a: First recessed portion
21b: Second recessed portion
22a: First proximity region
22b: Second proximity region
22c: Third proximity region
22d: Remaining region
23: Support
24: Resin layer precursor
25: Laminated sheet
26: Solvent
27: Inorganic insulation sol
28: Protruding portion

The invention claimed is:

1. A wiring board, comprising:
an inorganic insulating layer;
a conductive layer disposed on part of one main surface of the inorganic insulating layer;
a first resin layer disposed on another part of the one main surface of the inorganic insulating layer, the first resin layer covering side surfaces of the conductive layer and one main surface of the conductive layer on a side opposite to the inorganic insulating layer,
a second resin layer disposed on the other main surface of the inorganic insulating layer,
the part of the one main surface of the inorganic insulating layer including a plurality of first recessed portions each of which has at least partially circular shape in a plan view, part of the conductive layer entering into the plurality of first recessed portions,
the another part of the one main surface of the inorganic insulting layer includes a plurality of second recessed portions each of which has at least partially circular shape in a plan view,
wherein part of the first resin layer enters into the plurality of second recessed portions,
the inorganic insulting layer further includes a plurality of second inorganic insulating particles having a particle diameter larger than that of the first inorganic insulating particles, the respective second inorganic insulting particles are partly connected to the first inorganic insulating particles, and the second inorganic insulating particles are separated from each other with the first inorganic insulating particles interposed therebetween, and
a plurality of regions between the first recessed portions in the inorganic insulating layer are composed of only the first inorganic insulating particles among the first inorganic insulating particles and the second inorganic insulating particles.

2. The wiring board according to claim 1,
wherein at least one of the first recessed portions has a shape in which a plurality of circles are connected to each other in a plan view.

3. The wiring board according to claim 2,
wherein at least one of the first recessed portions has an elongated shape in which a plurality of circles are connected to each other in one direction in a plan view.

4. The wiring board according to claim 1,
wherein an average crystalline particle diameter in the part of the conductive layer which enters into the first recessed portions is smaller than an average crystalline particle diameter in another part of the conductive layer.

5. A mounting structure, comprising:
the wiring board according to claim 1; and
an electronic component which is mounted on the wiring board and is electrically connected to the conductive layer.

* * * * *